United States Patent
Grazioso et al.

(10) Patent No.: US 8,476,571 B2
(45) Date of Patent: Jul. 2, 2013

(54) SIPM PHOTOSENSOR WITH EARLY SIGNAL DIGITIZATION

(75) Inventors: Ronald Grazioso, Knoxville, TN (US); Debora Henseler, Erlangen (DE); Mathias J. Schmand, Lenoir City, TN (US); Nan Zhang, Knoxville, TN (US)

(73) Assignees: Siemens Aktiengesellschaft, Munich (DE); Siemens Medical Solutions USA, Inc., Malvern, PA (US)

( * ) Notice: Subject to any disclaimer, the term of this patent is extended or adjusted under 35 U.S.C. 154(b) by 287 days.

(21) Appl. No.: 12/898,771

(22) Filed: Oct. 6, 2010

(65) Prior Publication Data

US 2011/0147567 A1    Jun. 23, 2011

(51) Int. Cl.
*H01J 40/14* (2006.01)
*G01T 1/20* (2006.01)

(52) U.S. Cl.
USPC .................................. 250/214 R; 250/370.11

(58) Field of Classification Search
USPC ................. 250/208.1, 214 R, 370.08, 370.11
See application file for complete search history.

(56) References Cited

U.S. PATENT DOCUMENTS

| | | | | |
|---|---|---|---|---|
| 4,675,526 | A * | 6/1987 | Rogers et al. | 250/363.02 |
| 8,017,902 | B2 * | 9/2011 | Gratz et al. | 250/214.1 |
| 2009/0065704 | A1 * | 3/2009 | Heringa et al. | 250/370.11 |
| 2010/0104067 | A1 * | 4/2010 | Okada | 378/62 |
| 2012/0129274 | A1 * | 5/2012 | Prescher et al. | 438/4 |

FOREIGN PATENT DOCUMENTS

| | | | |
|---|---|---|---|
| WO | 2009001237 | A1 | 12/2008 |
| WO | 2009019659 | A2 | 2/2009 |
| WO | 2009019660 | A2 | 2/2009 |

OTHER PUBLICATIONS

Hamamatsu product catalog, "MPPC Multi-Pixel Photon Counter" Catalog No. KAPD0002E01, Jan. 2007, pp. 1-12.
Vinke, Ruud, "Optimizing timing resolution of SiPM sensors for use in TOF-PET detectors", NDIP Conference Talk, Jun. 20, 2008.
Kim, et al., Multi-Pixel Photon Counters for TOF PET Detector and its Challenges:, IEEE Trans, Nucl. Sci., vol. 56, Oct. 1999, pp. 2580-2585.
Frach, et al., "The Digital Silicon Photomultiplier—Principle of Operation and Intrinsic Detector Performance", IEEE Nuclear Science Symposium Conference Record, N-28-5, 2009, pp. 1959-1965.
Yokoyama, et al., "Development of Multi-Pixel Photon Counters", SNIC Symposium, Stanford, California, Apr. 3-6, 2006, pp. 1-6.
Yamamoto, et al., "Development of Multi-Pixel Photon Counter (MPPC)", 2006 IEEE Nuclear Science Symposium Conference Record, N30-102, pp. 1094-1097.

* cited by examiner

*Primary Examiner* — Thanh Luu
(74) *Attorney, Agent, or Firm* — Peter Kendall

(57) ABSTRACT

The present invention is a Silicon PhotoMulitplier comprising a plurality of photon detection cell clusters each comprising a plurality of avalanche photodiodes connected in parallel, so that the output of each avalanche photodiode is summed together and applied to a cell cluster output. Each of the plurality of cell cluster outputs is connected to one of a plurality of cluster readout circuits, each of which includes an analog to digital converter that converts an analog representation of the total energy received by a photon detection cell cluster to a digital energy signal. A SiPM Pixel reader circuit is connected to the plurality of cluster readout circuits and configured to generate an overall pixel output by digital processing the plurality of digital energy signals received from the plurality of photon detection cell clusters by way of the plurality of cluster readout circuits. The SIPM pixel reader circuit also receives digital signals representative of timing triggers and the total energy received by a specific photon detection cell cluster and generates an overall SiPM energy signal and overall timing trigger in response to the signals received from the plurality of cluster readout circuits.

17 Claims, 4 Drawing Sheets

SIPM PHOTOSENSOR WITH EARLY SIGNAL DIGITIZATION

BACKGROUND OF THE INVENTION

I. Field of the Invention

The present invention relates to photodiodes within medical imaging systems; more particularly, the present invention relates to silicon photomultipliers (SiPMs) in medical imaging systems.

II. Background Information

The standard photo detector used in positron emission tomography (PET) applications is the photomultiplier tube (PMT). The high gain, fast response and high sensitivity of PMTs have made them a viable detector for PET, but there exist several drawbacks. One drawback is the bulky size of PMTs, which leads to large overall detector size and can put a limit on the spatial resolution of a detector. PMTs are also highly sensitive to magnetic fields, making it impossible to implement PET with magnetic resonance imaging when PMTs are utilized as the photo detector.

A relatively new photo detector, SiPM, is well suited for PET applications. It has similar sensitivity and gain to the industry standard photomultiplier tube (PMT), but has two important advantages, smaller size and insensitivity to magnetic field. SiPMs are semiconductor photon sensitive devices made up of an array of very small Geiger-mode avalanche photodiode (APD) cells or SiPM microcells on a silicon substrate, wherein the APDs within each respective cell are connected in parallel. Each SiPM microcell is an individual photon counter and the sum of all the SiPM microcells is the output of the SiPM.

SiPM microcells vary in dimension from 10 to 100 microns depending on the mask used, and can have a density of up to 10000 per square mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs detects to a maximum wavelength of 1.6 µm, and has less multiplication noise than Ge. InGaAs is generally used for the multiplication region of a heterostructure diode, is compatible with high-speed telecommunications using optical fibers, and can reach speeds of greater than Gbit/s. Gallium nitride operates with UV light. HgCdTe operates in the infrared, to a maximum wavelength of about 14 µm, requires cooling to reduce dark currents, and can achieve a very low level of excess noise.

Silicon avalanche diodes can function with breakdown voltages of 100 to 2000V, typically. APDs exhibit internal current gain effect of about 100-1000 due to impact ionization, or avalanche effect, when a high reverse bias voltage is applied (approximately 100-500 V in silicon). Greater voltage can be applied to silicon APDs, which are more sensitive, compared to other semiconductor photodiodes, than to traditional APDs before achieving breakdown allowing for a larger operating gain, preferably over 100, because silicon APDs provide for alternative doping. Gain increases with reverse voltage, and APD gain also varies dependently on both reverse bias and temperature, which is why reverse voltage should be controlled in order to preserve stable gain. SiPMs can achieve a gain of $10^5$ to $10^6$, by operating with a reverse voltage that is greater than the breakdown voltage, and by maintaining the dark count event rate at a sufficiently low level.

Geiger-mode APDs produce a large, fast pulse of the same amplitude when struck by a photon no matter the energy of the photon. When many of these cells are placed together in an array, they can be combined into one large parallel circuit which will produce an output pulse proportional to the input photon pulse. This device is referred to as a SiPM. However, as the size of the array increase, so does the input capacitance to an amplifier and noise of the device. The supply voltage needed for a SiPM device varies from 30V to 100V depending on the junction type, and is less than the supply voltage needed for a PMT by a factor of from 10 to over 40. The capacitance and noise are proportional to the area of the SiPM device. The rise time of the device also increases with its capacitance, and the rise time and noise are major factors in determining the time resolution in PET. The timing resolution degrades if the rise time becomes longer and the signal becomes noisier. Therefore, the optimal SiPM device would be a very small, fast, low noise device. However, the smaller the device is, the fewer photons that can be collected to be used for the 511 keV energy discrimination. Thus, typically the size of the device needs to be compromised, resulting in a device that is as large as needed for adequate light collection and energy resolution.

The primary requirements for a photosensor for PET detection are high photon detection efficiency (PDE), low noise level and very high trigger time accuracy. These are the key parameters that influence the time resolution and energy resolution of the measured gamma events. In addition to these properties, the sensor also needs to be compatible with magnetic fields, if it is to be used for combined PET/MR imaging.

Developers have found that SiPMs show the most promising results for an MR-compatible detector that displays high energy and timing resolution. Notwithstanding, developers have found it to be a challenge to develop a SiPM-based detector that provides the same time resolution as the PMT-based block detectors used in modern time of flight (TOF)-PET scanners. There is a need for a SiPM-based detector that overcomes the problems associated with increasing the size of the active area of SiPM arrays.

SUMMARY OF THE INVENTION

Consistent with embodiments of the present invention, the present invention comprises a SiPM comprising a plurality of photon detection cell clusters each comprising a plurality of avalanche photodiodes connected in parallel, wherein the bias connection of each avalanche photodiode within each photon detection cell cluster is connected to a common voltage signal line and the signal output of each avalanche photodiode is summed together and applied to a cell cluster output. Each of the plurality of cell cluster outputs is connected to one of a plurality of cluster readout circuits, each of which includes an analog to digital converter that converts an analog representation of the total energy received by a photon detection cell cluster to a digital representation of the total energy received. A SiPM Pixel reader circuit is connected to the plurality of cluster readout circuits and configured to generate an overall pixel output by digital processing of digitized photon detection cell cluster signals received from the plurality of cluster readout circuits. The SiPM pixel reader circuit also receives digital signals representative of timing triggers and total energy received by a specific photon detection cell cluster, wherein the total energy received by a specific photon detection cell cluster is representative of the total energy received by a pixel region of a photo detector, which is a linear representation of the energy associated with a pixel region associated with the cell cluster. The SiPM pixel reader circuit generates an overall SiPM energy signal and overall timing trigger in response to the signals received from the plurality of cluster readers.

It is to be understood that both the foregoing summary of the invention and the following detailed description are exemplary and explanatory only, and should not be considered restrictive of the scope of the invention, as described and claimed. Further, features and/or variations may be provided in addition to those set forth herein

BRIEF DESCRIPTION OF THE DRAWINGS

The accompanying drawings, which are incorporated in and constitute a part of this disclosure, illustrate various embodiments and aspects of the present invention. In the drawings.

GENERAL DESCRIPTION

Figure 1:
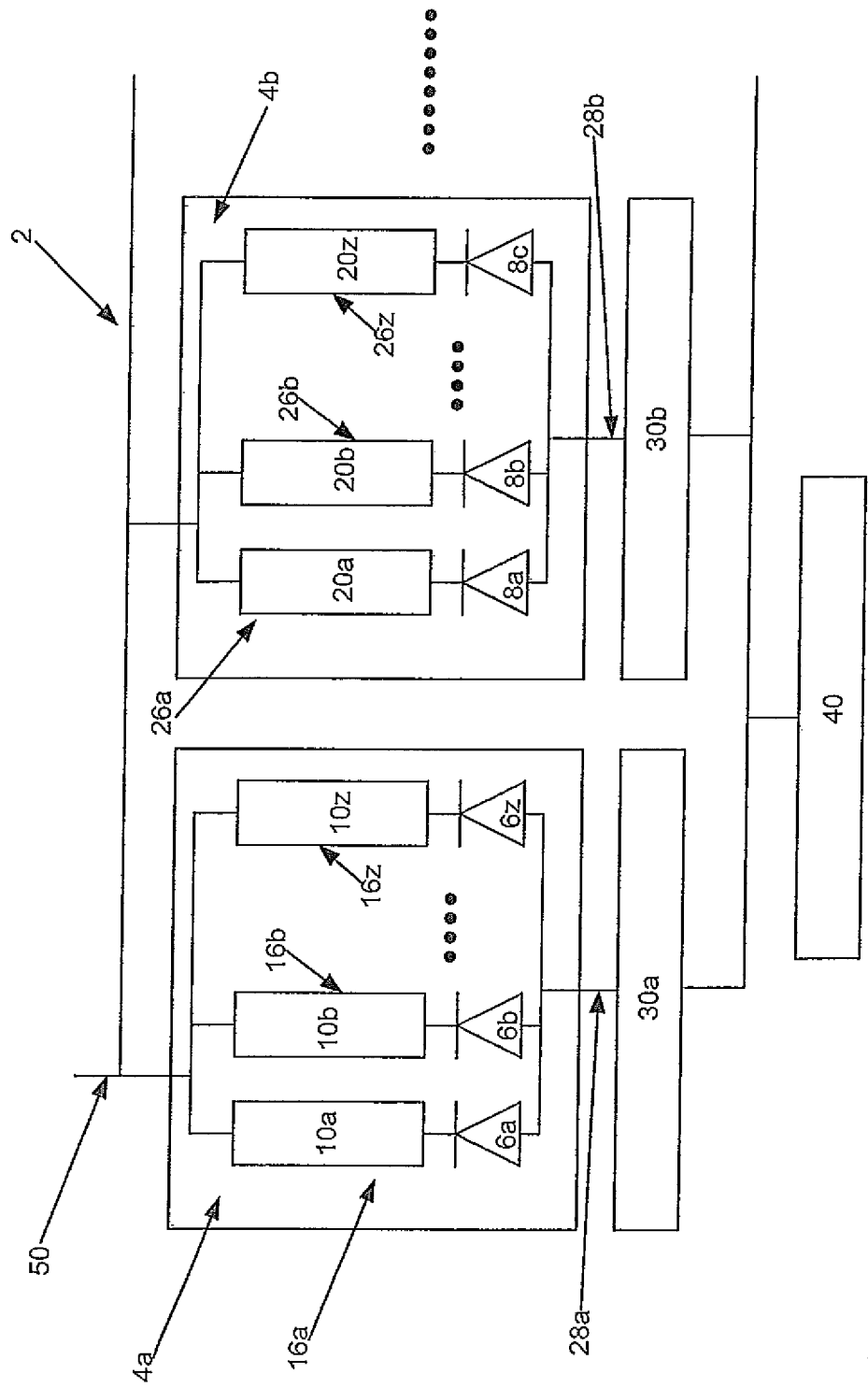
FIG. 1 is a schematic example of a SiPM pixel constructed of cell clusters in an embodiment of the present invention.

A SiPM is an array of microcells all connected together to form one single device. The more pixels and the larger the device, the better the light collection of the device, which in turn can produce better energy resolution. On the other hand, when fewer pixels are used and the device is smaller, the timing resolution of the device can be enhanced by the lower capacitance and lower noise. The present invention comprises a SiPM comprised of a plurality of photon detection cell clusters, wherein each cell cluster comprises a plurality of Geiger-mode APDs connected in parallel. The output of each photon detection cell cluster, which is the sum of the outputs of the Geiger-mode APDs within the cell cluster, is digitized by one of a plurality of cluster readout circuits. Each cluster readout circuit transmits a digital representation of a cell cluster output to a SiPM pixel reader circuit, which shall include digital data representative of a timing trigger and the total energy received by a specific cell cluster. The digital representation of the cell cluster output signal is representative of the summed total of the energy of each Geiger-mode APD within the cell cluster, which is a linear representation of the energy associated with a pixel region associated with the photon detection cell cluster. The SiPM pixel reader circuit generates an overall SiPM energy signal and overall timing trigger in response to the signals received from the plurality of cluster readers. The overall output for a SiPM pixel reader circuit is obtained by digital processing of all the digitized photon detection cell cluster signals. Accordingly, each photon detection cell cluster operates as an analog SiPM through the connection of the plurality of Geiger-mode APDs in parallel.

An important aspect of the present invention is the formation of photon detection cell clusters including a plurality of Geiger-mode APDs and the early digitization of the outputs of the cell clusters. This configuration differs from that of a standard prior art analog SiPM by the digitization of the signal at the cluster level and from a fully digital prior art SiPM by way of the summing of the analog signals output from each APD within a cell cluster, and the subsequent digitization of the cell cluster outputs, resulting in an improvement in timing resolution and signal to noise level.

In accordance with a first embodiment of the invention, the plurality of Geiger-mode APDs, the plurality of cluster readout circuits and the SiPM pixel reader circuit are integrated on the same substrate (for example silicon or compound semiconductor materials).

In accordance with a second embodiment of the invention, the plurality of Geiger-mode APDs within a photon detection cell cluster of the SiPM are integrated on one substrate (for example silicon or compound semiconductor materials) and a second wafer that includes integrated electronics, including the plurality of cluster readout circuits and the SiPM pixel reader circuit, would be bump bonded to the substrate. There would be a separate single contact to each of the photon detection cell cluster connections. The active area fill factor of the substrate upon which the Geiger-mode APDs of the photon detection cell cluster are positioned shall be higher than in the embodiment in which the plurality of Geiger-mode APDs, the plurality of cluster readout circuits and the SiPM pixel reader circuit are integrated on the same substrate. The space required for the connections in this embodiment may also be limited to a reasonable level because one connection per cell cluster is required in this embodiment in comparison to one connection per SiPM microcell as required in the prior art fully digital SiPM.

In accordance with a third embodiment of the invention, the plurality of Geiger-mode APDs within a photon detection cell cluster of the SiPM are integrated on first side of a photo sensitive wafer and the integrated electronics, including the plurality of cluster readout circuits and the SiPM pixel reader circuit, would be integrated on the back side of the photo sensitive wafer, thereby enabling a higher active area fill factor. A separate connection for example by a through-silicon-via (TSV) would also be needed for each photon detection cell cluster in this embodiment.

DETAILED DESCRIPTION

The following detailed description refers to the accompanying drawings. Wherever possible, the same reference numbers are used in the drawings and the following description to refer to the same or similar parts. While several embodiments and features of the invention are described herein, modifications, adaptations and other implementations are possible, without departing from the spirit and scope of the invention. Rather these embodiments are provided so that this disclosure will be complete and will fully convey the invention to those skilled in the art. For example, substitutions, additions or modifications may be made to the components illustrated in the drawings, and the methods described herein may be modified by substituting, reordering or adding steps to the disclosed methods. Accordingly, the following detailed description does not limit the invention. Instead, the proper scope of the invention is defined by the appended claims.

In accordance with an embodiment of the invention, The configured SiPM illustrated in FIG. 1 facilitates the operation of each photon detection cell cluster 4a and 4b as analog SiPMs through the connection of a plurality of Geiger-mode APDs connected in parallel in order to facilitate the summing of the output of each Geiger-mode APD 6 and 8. The analog output of each photon detection cell cluster 28a and 28b is digitized at an early level within the cluster readout circuits 30a and 30b, which leads to improvements in timing resolution, and signal to noise level, wherein the timing resolution and the signal to noise level of the SiPM illustrated in FIG. 1 is similar to that of purely a digital prior art SiPM.

FIG. 1 illustrates a schematic representation of an embodiment of the present invention comprising a SiPM pixel 2 constructed of a plurality of cell clusters 4a and 4b which are connected to a plurality of cluster readout circuits 30a and 30b which are connected to a SiPM Pixel reader circuit 40. Each of the plurality of cell clusters 4a and 4b are comprised of a plurality of SiPM microcells. A first cell cluster 4a within SiPM pixel 2 is comprised of SiPM microcells 16a and 16b-16z, and a second cell cluster 4b is comprised of SiPM microcells 26a and 26b-26z. Each SiPM microcell shall include at least a series resistor, and an APD. As illustrated in FIG. 1, SiPM microcell 16a includes series resistors 10a connected to the anode of APD 6a. SiPM microcell 16b includes series resistors 10b connected to the anode of APD 6b and SiPM microcell 16z includes series resistors 10z connected to the anode of APD 6z. SiPM microcells 16a and 16b-16z are all connected in parallel. The series resisters 10a and 10b-10z are connected to a common voltage line 50. The cathode of APDs 6a and 6b-6z are connected in parallel so that the output signal from each APD 6a and 6b-6z within the cell cluster 4a are summed together and applied to a cell cluster output 28a, which is transmitted to a cluster readout circuit 30a.

Figure 3:
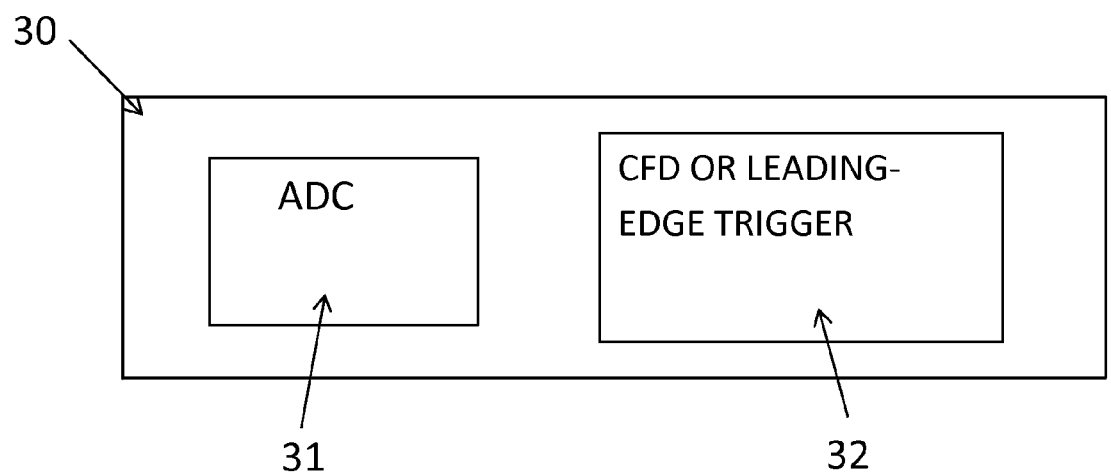
FIG. 3 is a block diagram showing detail of a cluster readout circuit 30 of FIG. 2.

The cluster readout circuit 30a, which includes an analog to digital converter as shown in FIG. 3 as ADC 31, is configured to receive and convert an analog energy signal from the photon detection cell cluster 4a to a multi-bit digital energy signal and to generate timing triggers using, for example a constant fraction discriminator CFD or leading edge trigger as shown in FIG. 3 as CFD/leading edge trigger 32. It is contemplated that the cluster readout circuit 30a may generate a timing trigger, in one embodiment by crossing a predetermined trigger level. It is further contemplated that in an embodiment, the trigger levels within the plurality of cluster readout circuits may vary between the respective photon detection cell clusters within a SiPM configured in accordance with the present invention. The multi-bit energy signals generated by the cluster readout circuit 30a are generated to facilitate digital representation of cell cluster 4a energy signals that have a bit depth greater than one bit, which thereby facilitates the digital representation of cell linear representations of energy received by cell cluster 4a. The multi-bit digital energy signal and timing triggers are transmitted to a SiPM Pixel reader circuit 40.

A second cell cluster 4b within SiPM pixel 2 is comprised of SiPM microcells 26a and 26b-26z. Each SiPM microcell shall include at least a series resistor, and an APD. As illustrated, SiPM microcell 26a includes series resistors 20a connected to the anode of APD 8a. SiPM microcell 26b includes series resistors 20b connected to the anode of APD 8b and SiPM microcell 26z includes series resistors 20z connected to the anode of APD 8z. SiPM microcells 26a and 26b-26z are all connected in parallel. The series resisters 20a and 20b-20z are connected to a common voltage line 50. The cathode of APDs 8a and 8b-8z are connected in parallel so that the output signal from each APD 8a and 8b-8z within the cell cluster 4b are summed together and applied to a cell cluster output 28b, which is transmitted to a cluster readout circuit 30b.

The cluster readout circuit 30b, which includes an analog to digital converter (not shown), is configured to receive and convert an analog energy signal from the photon detection cell cluster 4b to a multi-bit digital energy signal and to generate timing triggers using, for example a CFD or leading edge trigger (not shown). It is to be understood that the examples of CFD and leading edge triggers are provided as examples only and are in way intended to limit the scope of the invention. To the extent other timing triggers may be implemented to facilitate the cluster readout circuits within the SiPM being able to set a threshold level and identify an APD as having received a photon of energy upon the cluster readout circuit exceeding the threshold level. It is further contemplated that in an embodiment, the trigger levels within the plurality of cluster readout circuits may vary between the respective photon detection cell clusters within a SiPM configured in accordance with the present invention. The multi-bit energy signals generated by the cluster readout circuit 30b are generated to facilitate digital representation of cell cluster 4b energy signals that have a bit depth greater than one bit, which thereby facilitates the digital representation of cell linear representations of energy received by cell cluster 4b. The multi-bit digital energy signal and timing triggers are transmitted to a SiPM Pixel reader circuit 40. The timing trigger can be digitized by a time-to-digital converter (TDC) either in the cluster readout circuits 30a, 30b or in the Pixel reader circuit 40.

The SiPM Pixel reader circuit 40 is configured to generate an overall photo detector energy signal, by digital summing the digitized cell cluster signals received from cluster readout circuits 30a and 30b, and an overall timing trigger. The overall timing trigger may be generated, for example in one embodiment, by using the first, second or higher-order timing trigger of one of photon detection cluster cells 4a and 4b, or in an alternative embodiment performing logical operations on the triggers of photon detection cluster cells 4a and 4b. The digitized photon detection cluster cell signals received by the SiPM Pixel reader circuit 40 include timing triggers and total energy received by each of the specific photon detection cell clusters 4a and 4b within the SiPM 2, wherein the total energy received by specific photon detection cell clusters 4a and 4b is representative of the total energy received by a pixel region of the photo detector incorporating a SiPM configured in accordance with the present embodiment.

Figure 2:
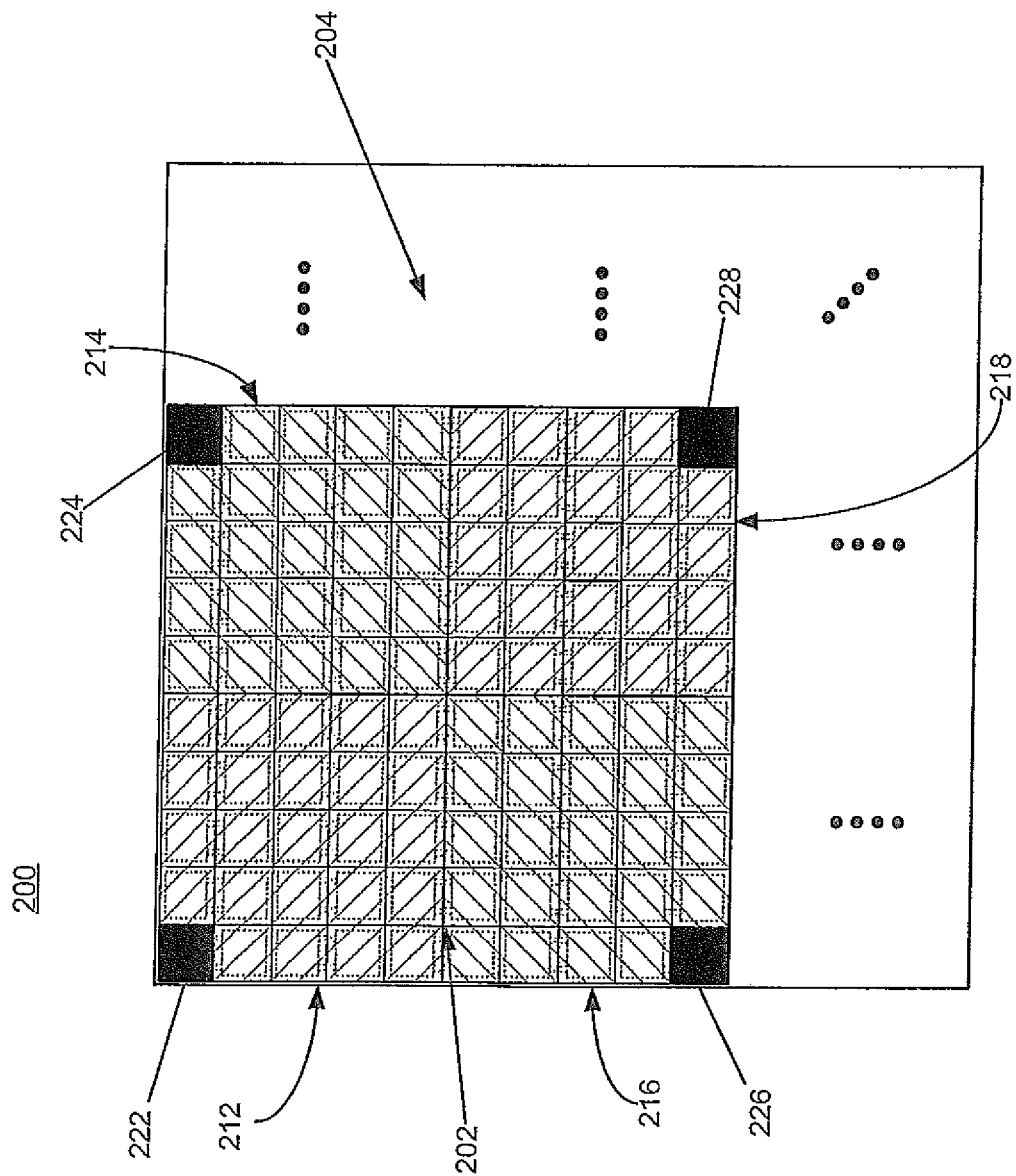
FIG. 2 is a top view of a SiPM sensor pixel illustrating four of the cell clusters that constitute the photosensitive area in an embodiment of the present invention.
Figure 4:
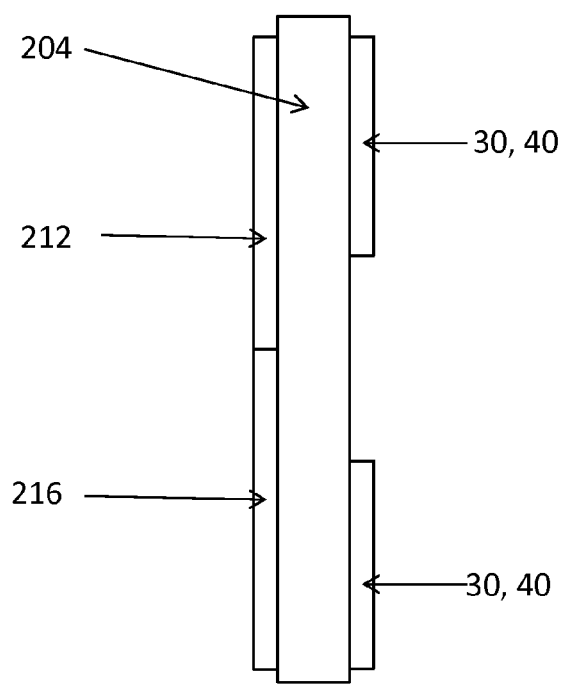
FIG. 4 is a side view of an embodiment in which cell cluster readout circuits and pixel reader circuitry are positioned on the opposite side of a substrate from photon detection cell clusters.
Figure 5:
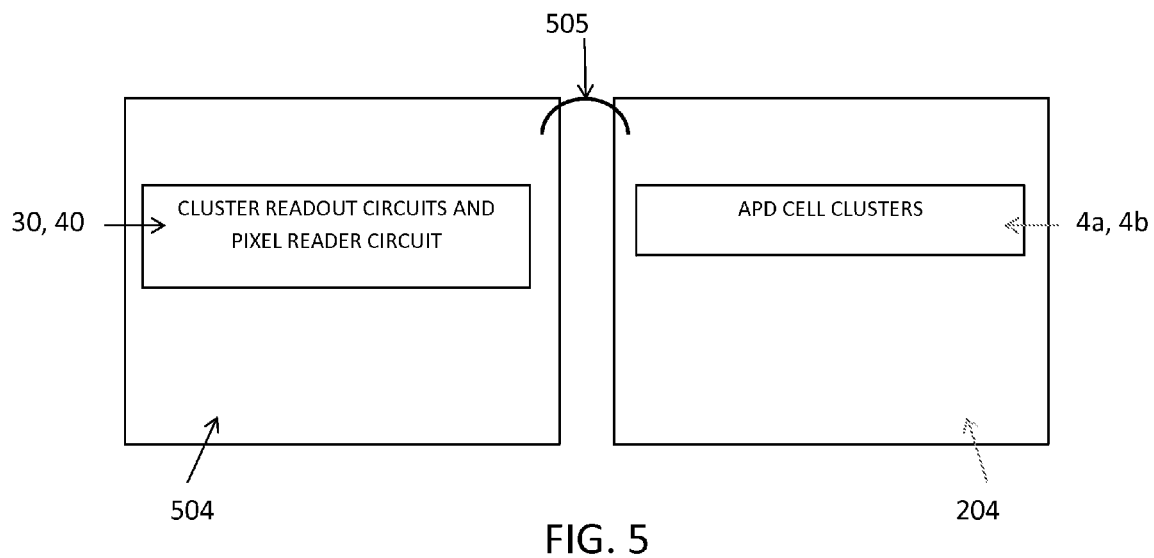
FIG. 5 is a top view of an embodiment in which cell cluster readout circuits and pixel reader circuitry are mounted on a separate substrate or wafer from photon detection cell clusters.

FIG. 2 is an illustration of a top view of a SiPM sensor pixel 200 showing four photon detection cell clusters 212, 214, 216 and 218 that constitute a photosensitive area within the SiPM sensor pixel 200. In the embodiment illustrated, each of the photon detection cell clusters 212, 214, 216 and 218 is comprised of twenty-five cells, wherein each of the cells within the photon detection cell clusters 212, 214, 216 and 218, except cells 222, 224, 226 and 228 are individual Geiger-mode SiPM microcells which include at least one APD, wherein the plurality of APDs within the Geiger-mode SiPM microcells in the photon detection cell clusters 212, 214, 216 and 218 are connected in parallel. In one embodiment, cells 222, 224, 226 and 228 are integrated circuitry celis, which comprise space within each photon detection cell cluster 212, 214, 216 and 218 where integrated circuitry is positioned on the substrate 204. The integrated circuitry comprises a plurality of cluster readout circuits and the SiPM pixel reader circuit. In an alternative embodiment as shown in FIG. 4, cells 222, 224, 226 and 228 may be used as space on a substrate 204 within a photon detection cell cluster 212, 214, 216, 218, for the positioning of an electrical contact for the summed signal lines from the plurality of APDs within the Geiger-mode APD cells extending through the first side of the substrate to the back side of the substrate upon which the integrated circuitry, comprising a plurality of cluster readout circuits 30 and the SiPM pixel reader circuit 40, is positioned. In another embodiment as shown in FIG. 5, cells 222, 224, 226 and 228 may be used as space on a first substrate 204 within a photon detection cell cluster 4a, 4b for the positioning of an electrical contact for the summed signal lines from the plurality of APDs within the Geiger-mode APD cells extending to bond 505 to a connection on a second substrate 504 that includes integrated circuitry comprising a plurality of cluster readout circuits and the SiPM pixel reader circuit 30, 40.

The above specification, examples and data provide a description of the manufacture and use of the invention. Since many embodiments of the invention can be made without departing from the spirit and scope of the invention, the invention resides in the claims hereinafter appended.

What is claimed is:

1. A silicon photomultiplier (SiPM) comprising:
   a plurality of photon detection cell clusters each comprising a plurality of avalanche photodiodes, wherein the outputs of each of the avalanche photodiodes within each of the plurality of photon detection cell clusters are summed together and applied to a cell cluster output;
   a plurality of cluster readout circuits, wherein each of the plurality of cluster readout circuits is connected to one of a plurality of cell cluster outputs to receive and convert an analog cell cluster output signal to a multi-bit digital signal; and
   a SiPM pixel reader circuit connected to a plurality of said cluster readout circuits and configured to generate an overall photo detector output by processing digital cell cluster signals received from the plurality of cluster readout circuits;
   wherein each photon detection cell cluster of the plurality of photon detection cell clusters includes at least a plurality of avalanche photodiodes connected in parallel.

2. The SiPM of claim 1 wherein the cathode of each avalanche photodiode within each photon detection cell cluster is connected to a common voltage signal line.

3. The SiPM of claim 1 wherein each cell cluster output signal received by one of the plurality of cluster readout circuits is an analog signal representative of the total energy received by the photon detection cell cluster during a specific period of time.

4. The SiPM of claim 1 wherein each of the plurality of cluster readout circuits includes at least one of a leading-edge trigger and a CFD that generate a timing trigger, wherein the multi-bit digital signal represents an energy signal having a bit depth greater than one bit.

5. The SiPM of claim 1 wherein the SiPM pixel reader circuit receives digital signals representative of timing triggers and total energy received by a specific photon detection cell cluster from each of the plurality of cluster readout circuits, wherein the total energy received by a specific photon detection cell cluster is representative of the total energy received by a pixel region of said SiPM.

6. The SiPM of claim 1 wherein the plurality of photon detection cell clusters, the plurality of cluster readout circuits, and the SiPM pixel reader circuit are integrated on a single semiconductor substrate.

7. The SiPM of claim 1 wherein the plurality of photon detection cell clusters are integrated on a first semiconductor substrate, and the plurality of cluster readout circuits and the SiPM pixel reader circuit are both integrated on a second semiconductor substrate.

8. The SiPM of claim 1 wherein the plurality of photon detection cell clusters are integrated on a first side of a semiconductor substrate, and the plurality of cluster readout circuits and the SiPM pixel reader circuit are both integrated on a second side of the semiconductor substrate.

9. A silicon photomultiplier (SiPM) comprising:
   a first wafer having a plurality of photon detection cell clusters integrated thereon, wherein each cell cluster includes a plurality of Geiger-mode avalanche photodiodes, wherein the outputs of each of the Geiger-mode avalanche photodiodes within a photon detection cell cluster are summed together and applied to a cell cluster output;
   a second wafer having a plurality of cluster readout circuits integrated thereon, wherein each of the plurality of cluster readout circuits is connected to one of a plurality of cell cluster outputs on the first wafer, wherein each cluster readout circuit includes an analog to digital converter for converting the output of the photon detection cell cluster to an X-bit digital signal, where X is an integer greater than one; and
   a SiPM pixel reader circuit integrated on the second wafer and connected to the plurality of cluster readout circuits and configured to generate an overall photo detector output signal by processing of the digital cell cluster signals received from the plurality of cluster readout circuits;
   wherein a plurality of Geiger-mode avalanche photodiodes in each photon detection cell cluster are connected in parallel.

10. The SiPM of claim 9 wherein the cathodes of each Geiger-mode avalanche photodiode within each photon detection cell cluster are connected to a common voltage signal line.

11. The SiPM of claim 9 wherein each cell cluster output signal received by one of the plurality of cluster readout circuits is an analog signal representative of the total energy received by the photon detection cell cluster during a specific period of time.

12. The SiPM of claim 9 wherein the SiPM pixel reader circuit receives digital signals representative of timing triggers and total energy received by a specific photon detection cell cluster, wherein the total energy received by a specific photon detection cell cluster is representative of the total energy received by a pixel region of said SiPM.

13. The SiPM of claim 9 wherein each of the plurality of cluster readout circuits is configured to generate a digital timing trigger along with the X-bit digital signal, wherein the X-bit digital signal facilitates digital representation of linear analog energy signals generated at each of the plurality of photon detection cell cluster outputs.

14. A silicon photomultiplier (SiPM) comprising:
   a silicon wafer having a plurality of photon detection cell clusters integrated on a first side of the silicon wafer, wherein each cell cluster includes a plurality of Geiger-mode avalanche photodiodes, wherein the outputs of each of the Geiger-mode avalanche photodiodes within a photon detection cell cluster are summed together and applied to a cell cluster output;
   the silicon wafer having a plurality of cluster readout circuits and a SiPM pixel reader circuit each integrated on a second side of the silicon wafer, wherein each of the plurality of cluster readout circuits is connected to one of a plurality of cell cluster outputs to receive and convert an analog cell cluster energy signal to an X-bit digital signal, where X is an integer greater than one; and
   wherein the SiPM pixel reader circuit is configured to generate an overall SiPM output signal by processing digital cell cluster signals received from the plurality of cluster readout circuits;
   wherein a plurality of Geiger-mode avalanche photodiodes of each photon detection cell cluster are connected in parallel.

15. The SiPM of claim 14 wherein the cathodes of each Geiger-mode avalanche photodiode within each photon detection cell cluster are connected to a common voltage signal line.

16. The SiPM of claim 14 wherein each cell cluster output signal received by one of the plurality of cluster readout circuits is converted by an analog to digital converter within each of the plurality of cluster readout circuits from an analog representation of the total energy received by the photon detection cell cluster to a digital representation of the total energy received by the photon detection cell cluster.

17. The SiPM of claim 14 wherein the SiPM pixel reader circuit receives digital signals representative of timing triggers and total energy received by a specific photon detection cell cluster, wherein the total energy received by a specific photon detection cell cluster is representative of the total energy received by a pixel region of said SiPM.

\* \* \* \* \*